(12) United States Patent
Hwang

(10) Patent No.: US 7,025,602 B1
(45) Date of Patent: Apr. 11, 2006

(54) CONTACT FOR ELECTRONIC DEVICES

(75) Inventor: Dong Weon Hwang, 2912 Cedar Pass Ct., Flower Mound, TX (US) 75022

(73) Assignees: Plastronics Socket Partners, L.P., Irving, TX (US); Dong Weon Hwang, Flower Mound, TX (US)

( * ) Notice: Subject to any disclaimer, the term of this patent is extended or adjusted under 35 U.S.C. 154(b) by 0 days.

(21) Appl. No.: 11/240,438

(22) Filed: Sep. 30, 2005

(30) Foreign Application Priority Data

Oct. 6, 2004 (KR) .................... 10-2004-0079649

(51) Int. Cl.
*H01R 12/00* (2006.01)

(52) U.S. Cl. ......................................................... 439/66

(58) Field of Classification Search ................... 439/66, 439/700, 824, 284; 324/761
See application file for complete search history.

(56) References Cited

U.S. PATENT DOCUMENTS

| | | | |
|---|---|---|---|
| 6,396,293 B1 | 5/2002 | Vinther et al. | |
| 6,398,592 B1 * | 6/2002 | Mori et al. | 439/700 |
| 6,462,567 B1 | 10/2002 | Vinther et al. | |
| 6,506,082 B1 * | 1/2003 | Meek et al. | 439/700 |
| 6,769,919 B1 * | 8/2004 | Kosmala | 439/66 |

* cited by examiner

*Primary Examiner*—Phuong Dinh
(74) *Attorney, Agent, or Firm*—Mark W. Handley; Chauza & Handley, L.L.P.

(57) ABSTRACT

This present invention relates to a contact (100) for electronic devices (1). More specifically, a contact (100) for electronic devices (1) has an upper contact pin (110) which includes a contact part (111) having a predetermined shape and contacting a lead of an object to be tested, that is, an integrated circuit (IC) (1), two support protrusions (112, 113) and a body (118); a lower contact pin (130) coupled to the upper contact pin (110) to be orthogonal to the upper contact pin (110); and a spring (190) fitted over a predetermined area between the upper and lower contact pins (110, 130).

15 Claims, 15 Drawing Sheets

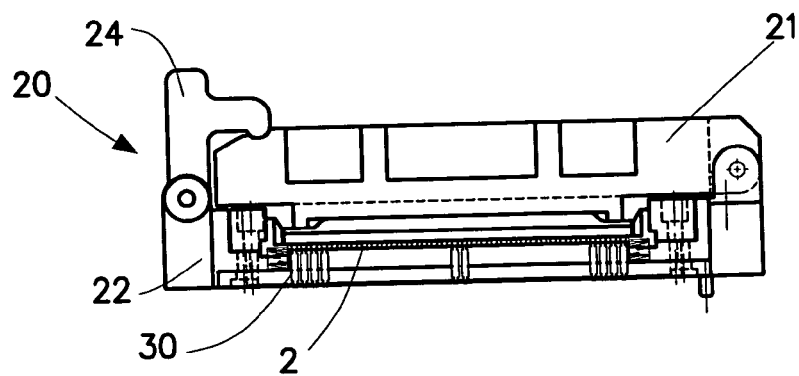
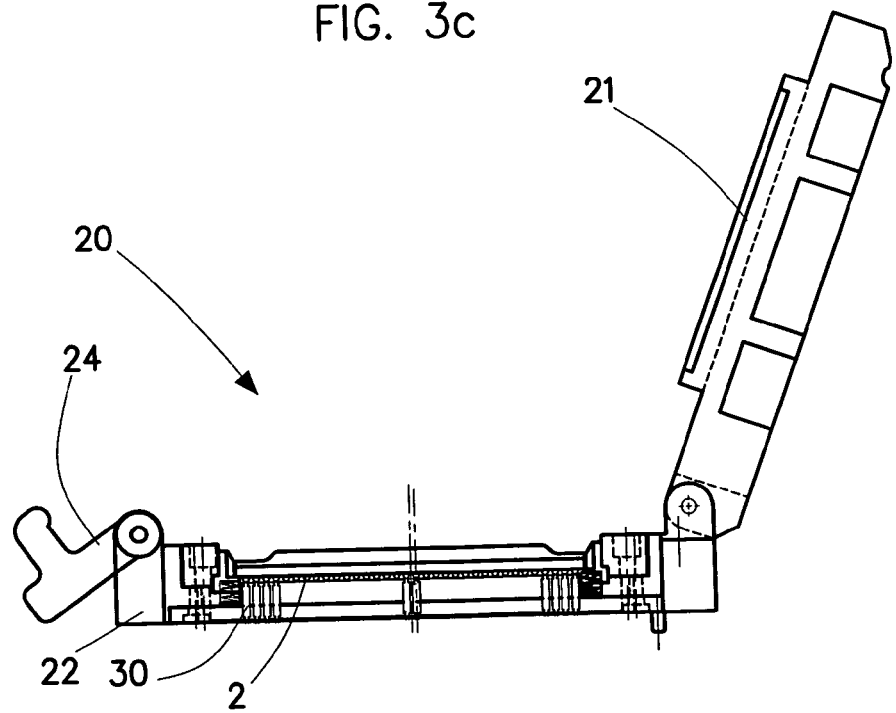

(PRIOR ART)

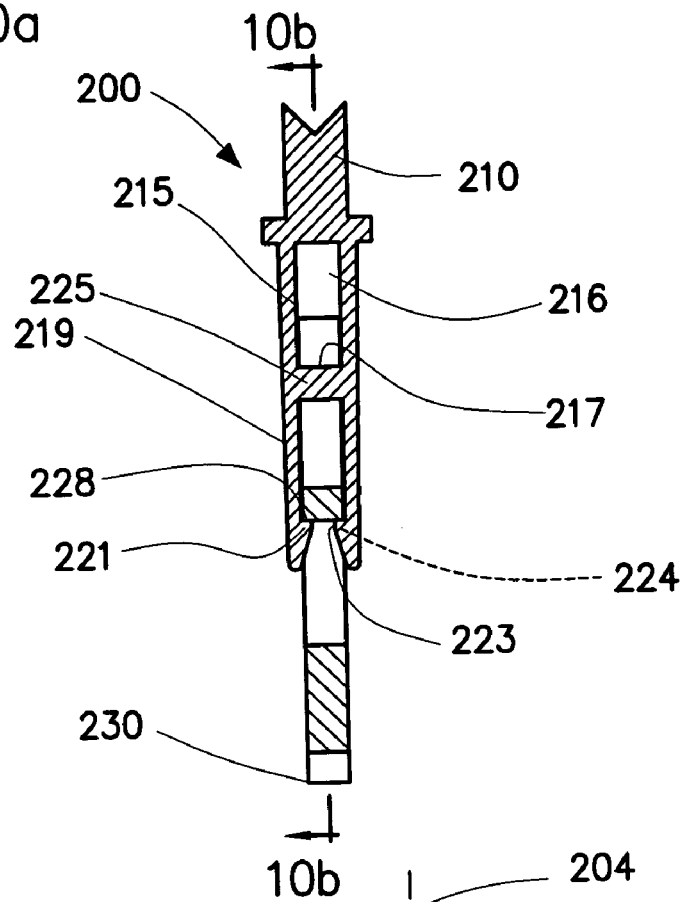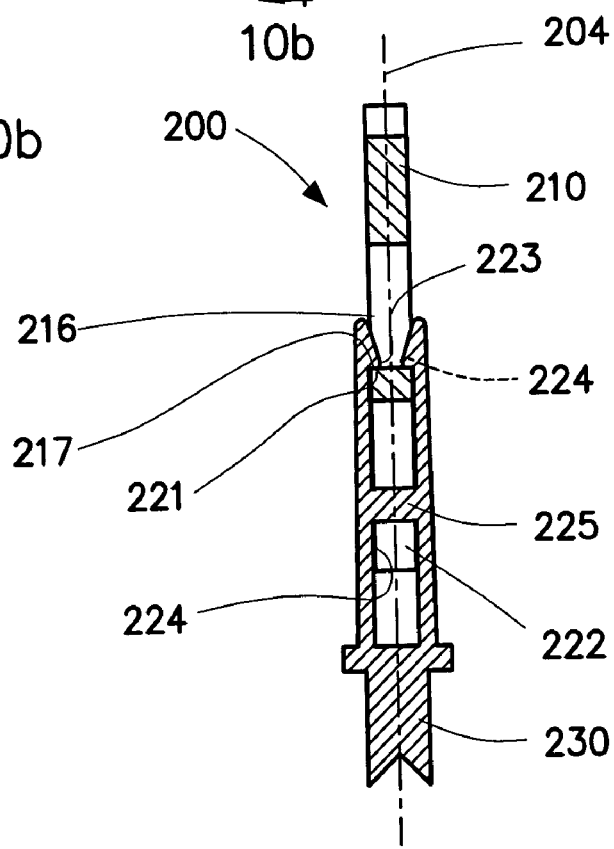

101

131

102

132

103

133

104

134

105

135

106

136

CONTACT FOR ELECTRONIC DEVICES

TECHNICAL FIELD OF THE INVENTION

The present invention relates generally to a contact for electronic devices, and more particularly to a contact for electronic devices which electrically connects a plurality of leads of an integrated circuit (IC) provided in a test socket to corresponding pads of a printed circuit board (PCB).

CROSS-REFERENCE TO RELATED APPLICATION

The present application is a continuation of Republic of Korea Patent Application Serial No. 10-2004-0079649, filed Oct. 6, 2004, entitled "CONTACT FOR ELECTRONIC DEVICE," and invented by Dong Weon Hwang, a citizen of the Republic of Korea, and a resident of the United States.

BACKGROUND OF THE INVENTION

Generally, a test socket 20 of FIGS. 3a to 3c receives a ball grid array-type semiconductor IC 1 of FIGS. 1a to 1c. Next, the IC 1 is electrically connected to a PCB 11 of FIG. 2. In such a state, the test socket performs the test of the IC 1.

As shown in FIGS. 3a to 3c, the test socket 20 performing such a function includes a cover 21, a latch 24, and a socket body 22. The cover 21 is compressed against and is in close contact with the IC 1 to be tested, thus forcing the IC 1 to be in close contact with an upper contact part of a conventional contact 30 which is positioned under the IC 1. The latch 24 locks the cover 21.

As shown in FIG. 4, the conventional contact 30 (called a pogo pin) is positioned under the IC to be tested in the test socket 20, and includes an upper contact pin 31, a lower contact pin 34, a coil spring 33, and a body 32. The body 32 surrounds the two contact pins 31 and 34 to prevent the removal of the contact pins 31 and 34, and has the coil spring 33 therein to provide elasticity to the contact pins 31 and 34, thus allowing the contact pins 31 and 34 to move in a vertical direction.

A copper alloy material having a rod shape is machined and gold-plated to manufacture the upper and lower contact pins 31 and 34. Further, the body 32 is manufactured through the following process. That is, a copper alloy material having a pipe shape is machined and gold-plated, and the two contact pins 31 and 34 and the gold-plated spring 33 are accommodated in the pipe providing the body 32. Subsequently, both ends of the pipe are narrowed so that thick parts of the contact pins 31 and 34 are stopped by the narrow ends, thus preventing the contact pins 31 and 34 from being removed from the body 32.

Generally, it is preferable that an electrical signal of the contact flow from the upper contact pin 31 through the inner surface of the body 32 to the lower contact pin 34. Since the electrical signal flows in this way, the electrical signal transmission distance becomes short, thus precisely indicating electrical properties.

Assuming that an electrical contact between the two contact pins 31 and 34 and the inner surface of the body 32 is poor, the electrical signal does not flow through the body 32 but flows through the spring 33. In this case, the signal transmission distance is increased. Consequently, the contact 30 cannot efficiently perform its function.

The conventional contact 30 is problematic in that the length (3.0 mm) of the body 32 is larger than the inner diameter (0.3 mm) of the body 32, and the plating state of the body 32 is poor, so that an electrical signal is not satisfactorily transmitted between the two contact pins 31 and 34. Further, as the contact is repeatedly used, debris generated by abrasion is caught between the contact pins 31 and 34, and the body 32, thus deteriorating electrical contact capacity. Further, the conventional contact 30 is problematic in that the contact 30 requires a greater number of components, so that it is difficult to assemble the components, thus productivity is low. Furthermore, manufacturing costs are high due to a large amount of machining work.

SUMMARY OF THE INVENTION

Accordingly, the present invention has been made keeping in mind the above problems occurring in the prior art, and an object of the present invention is to provide a contact for electronic devices, capable of efficiently transmitting an electrical signal from an upper contact pin to a lower contact pin.

Another object of the present invention is to provide a contact for electronic devices, which reduces the number of components, thus enhancing productivity, affording constant quality, and realizing mass production at low cost.

To achieve the above objects, a contact for electronic devices is provided having an upper contact pin, a lower contact pin and a spring. The upper contact pin has a contact part having a predetermined shape and contacting a lead of an object to be tested, that is, an integrated circuit (IC), two support protrusions, and a body. The lower contact pin is coupled to the upper contact pin to be orthogonal to the upper contact pin. The spring is fitted over a predetermined area between the upper and lower contact pins. The body of the upper contact pin includes inclined surfaces and hooks defined by protuberance portions extending from two symmetrical tangs providing an end of the body and defining two elastic parts which are symmetrical with respect to each other. A first channel is defined by the two tangs providing two elastic parts, and provides a space to allow movement of the lower contact pin, when the lower contact pin is coupled to the upper contact pin. A second channel is provided in the body of the upper contact to accommodate hooks of the lower contact pin therein such that the lower contact pin is movable, with the second channel being in electrical contact with hooks and side contact surfaces of the lower contact pin.

The second channel has a predetermined depth, with a thickness between two bottom ends of the second channel being equal to or larger than a distance between inner ends of the hooks of the elastic parts, which corresponds to a distance between channel contact parts, so that catch surfaces defined by the hooks of the lower contact pin contact a stop surface of the second channel, when the upper contact pin is coupled to the lower contact pin.

To achieve the above objects, a second contact for electronic devices is provided having an upper contact pin, a lower contact pin and a spring. The upper contact pin has a contact part having a predetermined shape and contacting a lead of an object to be tested, that is, an integrated circuit, two support protrusions, and a body. The lower contact pin is coupled to the upper contact pin to be orthogonal to the upper contact pin. The spring is fitted over a predetermined area between the upper and lower contact pins. The body of the upper contact pin includes inclined surfaces and hooks provided by protuberant portions extending from two tangs that provide two elastic parts provided to be symmetrical with respect to each other. A channel defined by an opening between the two elastic parts, and provides a space to allow movement of the lower contact pin, when the lower contact pin is coupled to the upper contact pin. A hole provides an opening in the body of the upper contact pin to accommodate hooks of the lower contact pin such that the lower contact pin is movable.

The stop rib provided between the channel and the hole is cut at a center thereof.

The contact part of the upper contact pin is selected out of various shapes, including a V shape, a shape of a V which is pointed at ends thereof, an A shape, a shape of an A which is pointed at an end thereof, a rounded A shape, and a rounded A shape which is pointed at an end thereof.

The shape of a contact part of the lower contact pin is preferably different from that of the contact part of the upper contact pin. The lower contact pin is preferably configured so that the contact part of the lower contact pin is solderable.

DESCRIPTION OF THE DRAWINGS

For a more complete understanding of the present invention and the advantages thereof, reference is now made to the following description taken in conjunction with the accompanying Drawings in which FIGS. 1 through 17 which show various aspects for a contact for electronic devices made according to the present invention, as set forth below:

FIG. 3b is a sectional view of a test socket and shows the cover of the test socket in a closed position;

FIG. 3c is a sectional view of a test socket and shows the cover of the test socket in an open position;

FIG. 10a is a front sectional view, as would be viewed if taken along section line 10a—10a of FIG. 9b, which shows the state where upper and lower contact pins of the contact for the second electronic device, according to the present invention, are coupled to each other;

FIG. 10b is a side sectional view, taken along section line 10b—10b of FIG. 10a, which shows the state where the upper and lower contact pins of the contact for the second electronic device, according to the present invention, are coupled to each other;

DETAILED DESCRIPTION OF THE INVENTION

Hereinafter, the present invention will be described in detail with reference to the attached drawings.

A contact 100 for a first electronic device according to the present invention will be described below with reference to FIGS. 5 through 8b.

Figure 5:
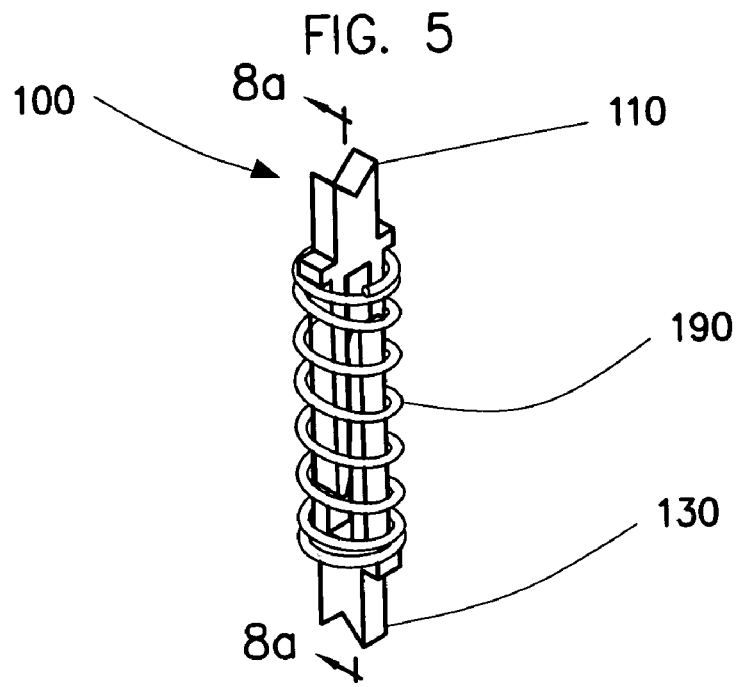
FIG. 5 is a perspective view of a contact for a first electronic device, according to the present invention.
Figure 6:
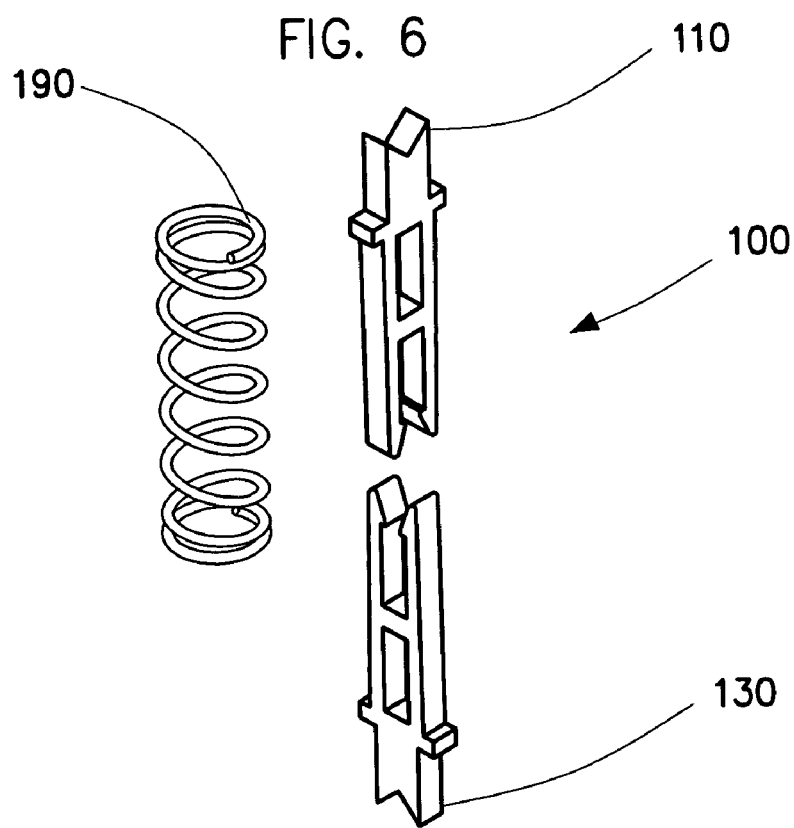
FIG. 6 is an exploded perspective view of the contact for the first electronic device, according to the present invention.
Figure 7A:
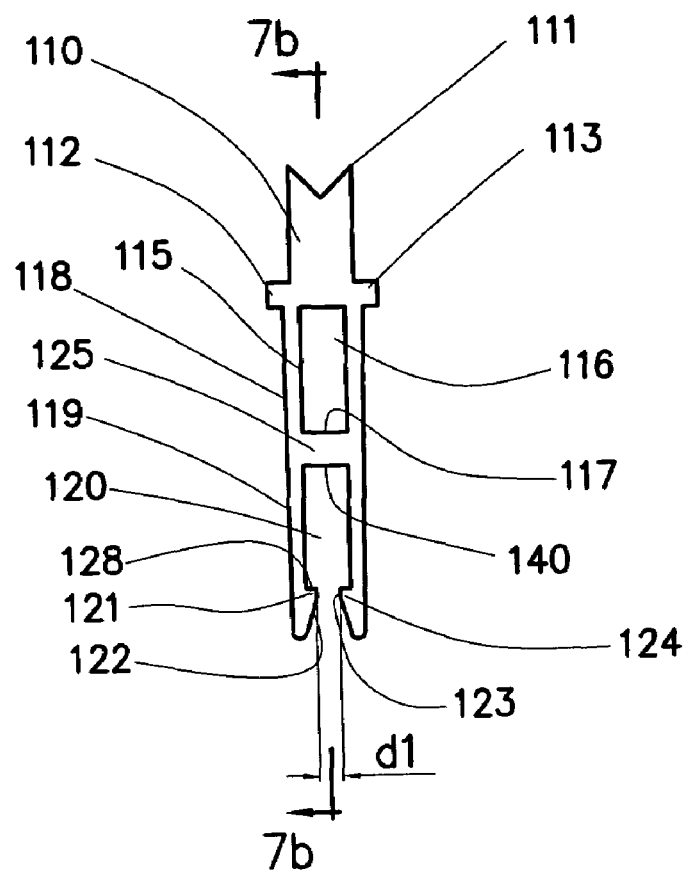
FIG. 7a is a front view of an upper contact pin of the contact for the first electronic device, according to the present invention.
Figure 7B:
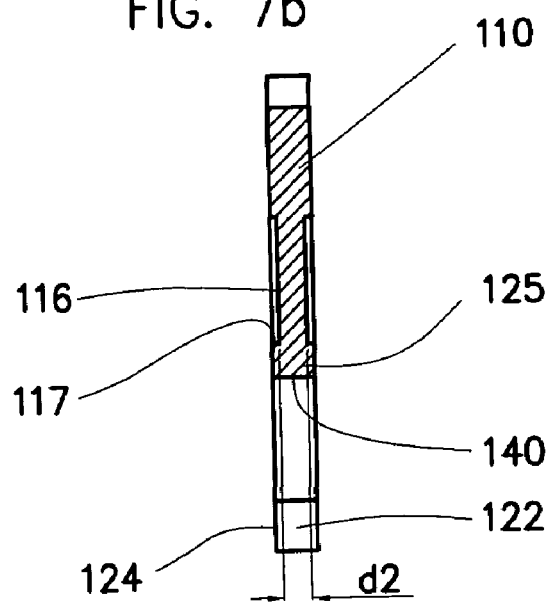
FIG. 7b is a side sectional view, taken along section line 7b—7b of FIG. 7a, of the upper contact pin of the contact for the first electronic device, according to the present invention.
Figure 8A:
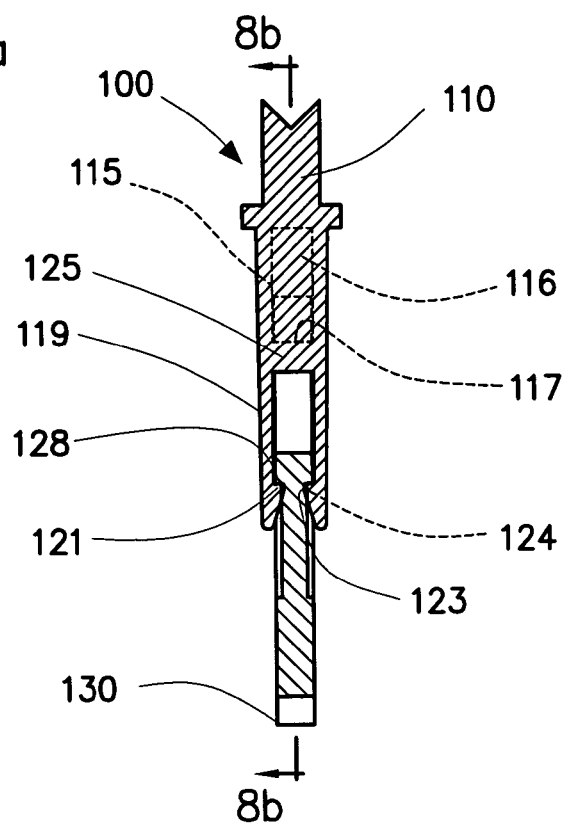
FIG. 8a is a front sectional view, taken along section line 8a—8a of FIG. 5, which shows the state where upper and lower contact pins of the contact for the first electronic device, according to the present invention, are coupled to each other.
Figure 8B:
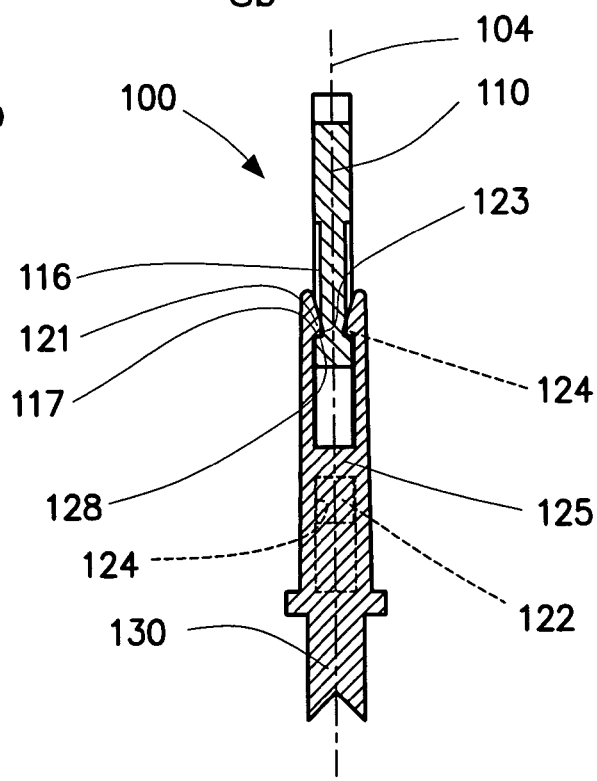
FIG. 8b is a side sectional view, taken along section line 8b—8b of FIG. 8a, which shows the state where the upper and lower contact pins of the contact for the first electronic device, according to the present invention, are coupled to each other.

FIG. 5 is a perspective view of a contact 100 for a first electronic device, according to the present invention, FIG. 6 is an exploded perspective view of the contact 100 for the first electronic device, according to the present invention, FIG. 7a is a front view of an upper contact pin 110 of the contact 100 for the first electronic device, according to the present invention, FIG. 7b is a side sectional view of the upper contact pin 110 of the contact for the first electronic device, according to the present invention, FIG. 8a is a front sectional view to show the state where upper and lower contact pins 110 and 130 of the contact 100 for the first electronic device, according to the present invention, are coupled to each other, and FIG. 8b is a side sectional view to show the state where the upper and lower contact pins 110 and 130 of the contact 100 for the first electronic device, according to the present invention, are coupled to each other.

As shown in FIGS. 5 and 6, the contact 100 for the first electronic device, according to this invention, includes an upper contact pin 110, a lower contact pin 130, and a spring 190. The upper and lower contact pins 110 and 130 have the same construction, and are coupled to be aligned in an orthogonal orientation to each other. The orthogonal orientation is with one contact pin disposed at an angular displacement of ninety degrees about a longitudinal axis of the contact pin, with respect to a mating contact pin. The open ends of the contact pins having the hooks are also aligned in opposite directions along the longitudinal axis of the contact. The spring 190 provides a resilient biasing member which is fitted over a predetermined area between the upper and lower contact pins 110 and 130.

The upper and lower contact pins 110 and 130 are produced by fabricating a sheet made of copper alloy through sheet metal working. The shape of each of the contact pins 110 and 130 and the thickness of each of the contact pins 110 and 130, which vary slightly, are achieved using a sheet metal stamping die. Preferably, the contact pins 110 and 130 and the spring 190 are plated with gold so as to maintain constant electrical properties, and such that ends of the contact pins 110 and 130 are solderable.

Further, as shown in FIGS. 7a and 7b, the upper contact pin 110 includes a V-shaped contact part 111, two support protrusions 112 and 113, and a body 118. The V-shaped contact part 111 contacts a ball-shaped lead 2 of a semiconductor IC 1, which is shown in FIG. 1c.

The structure and function of this embodiment have been described using the upper contact pin 110. However, they may be illustrated with the lower contact pin.

The body 118 includes two longitudinally extending tangs 119 which extend to define two elastic parts which are symmetrical with respect to each other. An inclined surface 122 and a hook 121 having a catch surface 128 are provided by protuberant portions extending on an end of each of the tangs defining the elastic parts 119. The catch surfaces 128 are preferably planar, but may be of other shapes. A first channel 120 is defined by the two elastic parts 119, and provides a space to allow relative movement of the contact pins 110 and 130. Further, a second channel 116 is provided in the body 118, and is in stable electrical contact with hooks 121 and side contact surfaces provided by sidewalls 115 of another contact pin 130.

The second channel 116 has a predetermined depth. The thickness d2 between two bottom ends of the second channel 116 is equal to or larger than the distance d1 between the inner ends defining catch surfaces 128 of the hooks 121 of the elastic parts defined by the tangs 119, which corresponds to a distance between channel contact parts 123. Thus, when the upper contact pin 110 is coupled to the lower contact pin 130, the catch surfaces 128 of the hooks 121 of one of the contact pins 110 and 130 contact the bottom of the second channel 116 of the other of the contact pins 110 and 130.

The upper and lower contact pins 110 and 130 constructed as described above are coupled to each other, as shown in FIGS. 8a and 8b, slidably moveable relative to one another.

That is, two hooks 121 of one of the contact pins 110 and 130 are stopped by the catch surfaces 128 of the hooks 121 engaging a stop surface 117 which is provided on rib portion 125 defining an end of the second channel of the other of the contact pins 110 and 130, thus preventing undesirable removal of the contact pins 110 and 130, after the contact pins 110 and 130 have been coupled to each other.

Further, the two contact pins 110 and 130 are coupled to be orthogonal to each other, with respective ends facing in opposite direction and one of the two contact pins 110 and 130 rotated approximately ninety degrees about the longitudinal axis of the contact with respect to the other of the two contact pins 110 and 130. The orthogonal orientation maintains electrical contact, because the channel contact parts 123 of the two hooks 121 of one of the contact pins 110 and 130 are biased toward both sides of the bottom of the second channel 116 of the other of the contact pins 110 and 130, due to low elasticity. That is, the elasticity of the two elastic members 119 provided by the two tangs are elastically engaging the bottom surface of respective ones of the channels 116.

Further, the probability that one point of each side contact surface 124 of the hooks 123 of one of the contact pins 110 and 130 is in electric contact with one point of each sidewalls 115 provided on the second channel 116 of the other of the contact pins 110 and 130 is maximized. Thus, eight side contact surfaces 124 of the hooks 121 of the two contact pins 110 and 130 and eight sidewalls 115 of the second channels 116 corresponding to the side contact surfaces 124 are in electrical contact with each other at one or more positions, thus maximizing the probability of contact.

The contact 100 for the first electronic device, according to this invention, constructed as described above allows the upper contact pin 110 and the lower contact pin 130 to stably electrically contact each other, thus efficiently transmitting a high-frequency signal and a relatively large current.

A contact 200 for a second electronic device, according to this invention, will be described with reference to FIGS. 9a to FIG. 10b.

Figure 9A:
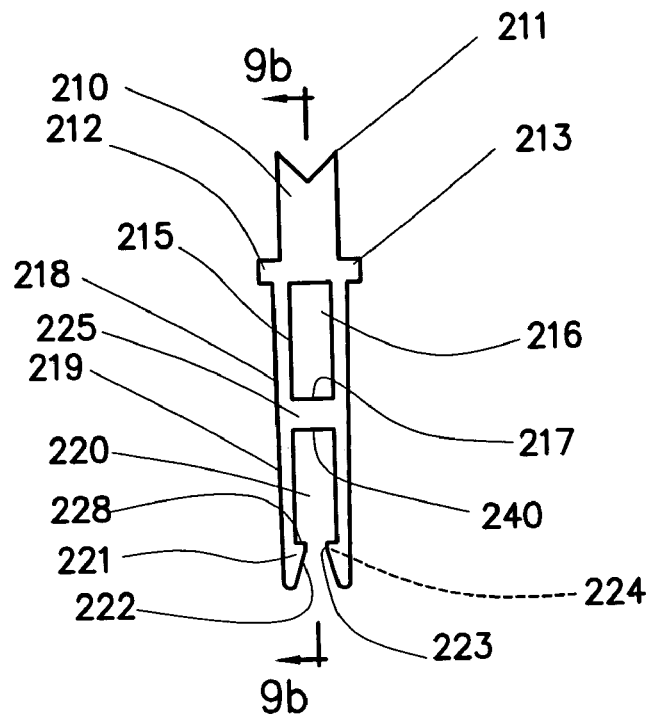
FIG. 9a is a front view of an upper contact pin of a contact for a second electronic device, according to the present invention.
Figure 9B:
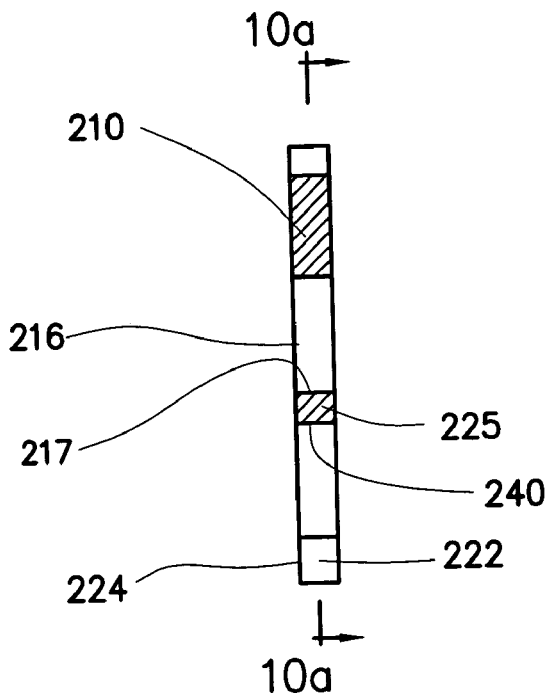
FIG. 9b is a side sectional view, taken along section line 9b—9b of FIG. 9a, of the upper contact pin of the contact for the second electronic device, according to the present invention.

FIG. 9a is a front view of an upper contact pin 210 of a contact 200 for a second electronic device, according to the present invention. FIG. 9b is a side sectional view of the upper contact pin 210 of the contact 200 for the second electronic device, according to the present invention. FIG. 10a is a front sectional view to show the state where upper and lower contact pins 210 and 230 of the contact 200 for the second electronic device, according to the present invention, are coupled to each other. FIG. 10b is a side sectional view to show the state where the upper and lower contact pins 210 and 230 of the contact 200 for the second electronic device, according to the present invention, are coupled to each other, slidably moveable along the longitudinal axis 208.

The contact 200 for the second electronic device according to this invention includes the upper contact pin 210, the lower contact pin 230, and a spring (not shown). The upper and lower contact pins 210 and 230 have the same construction, and are coupled to be orthogonal to each other. The spring provides a resilient biasing member which is fitted over a predetermined area between the upper and lower contact pins 210 and 230.

Since the spring of the contact 200 for the second electronic device according to this invention has the same construction and function as the spring 190 of the contact 100 for the first electronic device, the spring will not be described in detail herein.

Further, since the lower contact pin 230 of the contact 200 for the second electronic device according to this invention has the same construction and function as those of the upper contact pin 210 that will be described below, the description of the lower contact pin 230 will be omitted herein.

The construction and function of the upper contact pin 210 of the contact 200 for the second electronic device according to this invention remain the same as those of the upper contact pin 110 of the contact 100 for the first electronic device, except that a hole 216 is formed in place of the second channel 116 defined in the upper contact pin 110.

Further, reference numerals 211, 212 and 213, 215, 217, 218, 219, 220, 221, 222, 223, 224 and 225 of FIG. 9a correspond respectively to the contact part 111, the support protrusions 112 and 113, the sidewalls 115, the stop surface 117, the body 118, the elastic part 119, the first channel 120, the hook 121, the inclined surface 122, the channel contact part 123, the side contact surface 124, and the rib portion 125 of the contact 100 for the first electronic device. The corresponding components have the same construction and function.

A contact 300 for a third electronic device, according to the present invention, will be described with reference to FIGS. 11a to 12b.

Figure 11A:
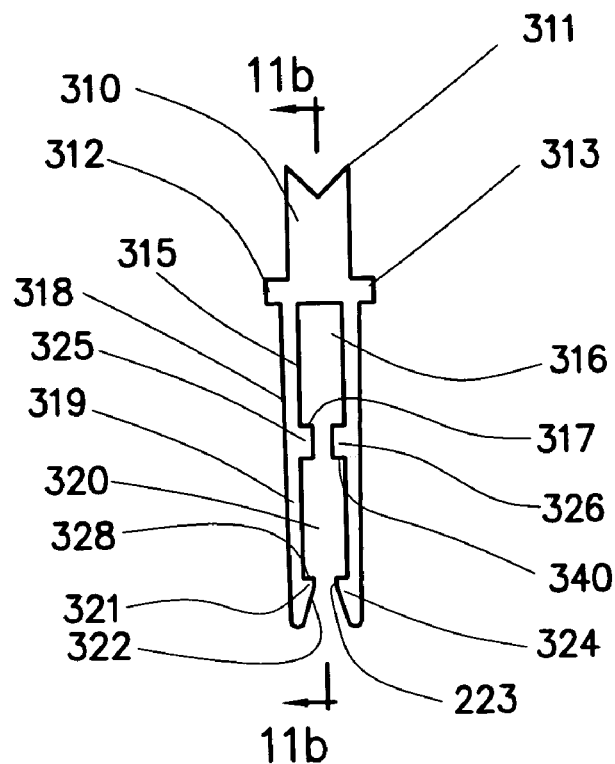
FIG. 11a is a front view of an upper contact pin of a contact for a third electronic device, according to the present invention.
Figure 11B:
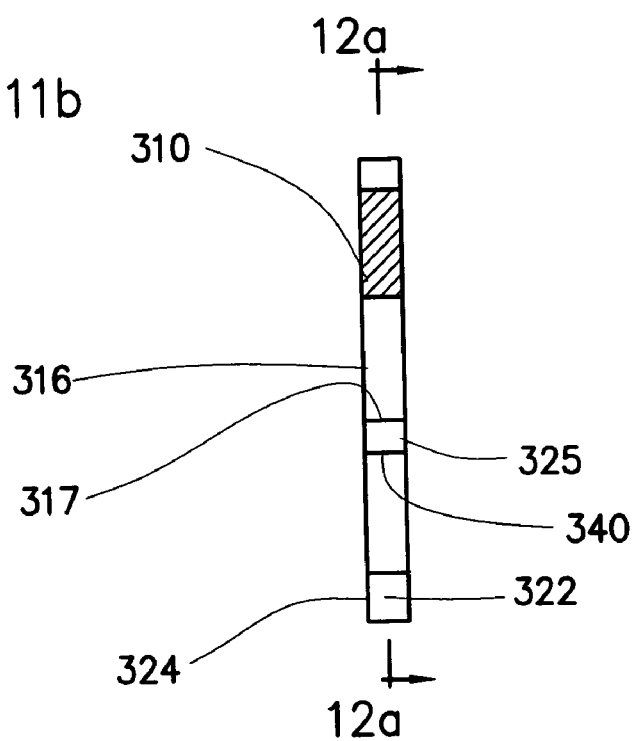
FIG. 11b is a side sectional view, taken along section line 11b—11b of FIG. 11a, of the upper contact pin of the contact for the third electronic device, according to the present invention.
Figure 12A:
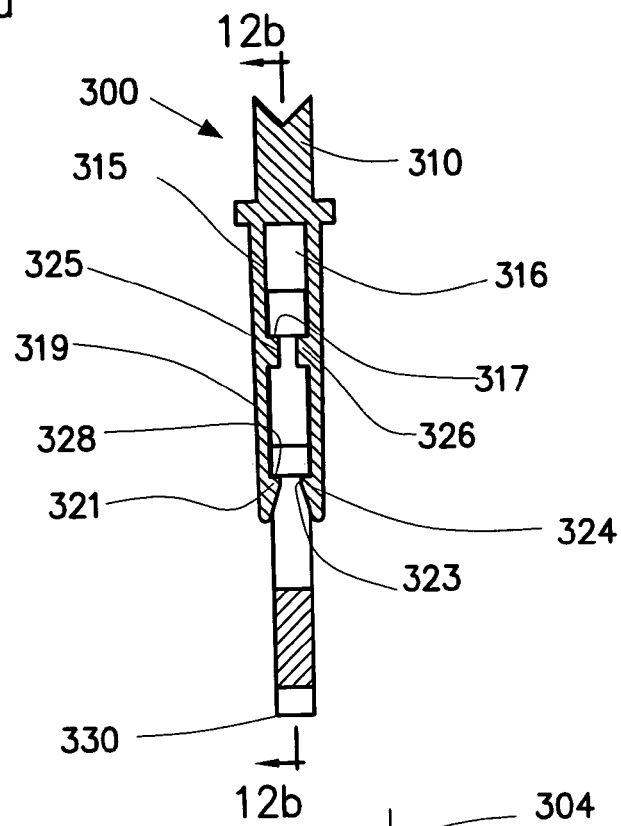
FIG. 12a is a front sectional view, as would be viewed if taken along section line 12a—12a of FIG. 11b, which shows the state where upper and lower contact pins of the contact for the third electronic device, according to the present invention, are coupled to each other.
Figure 12B:
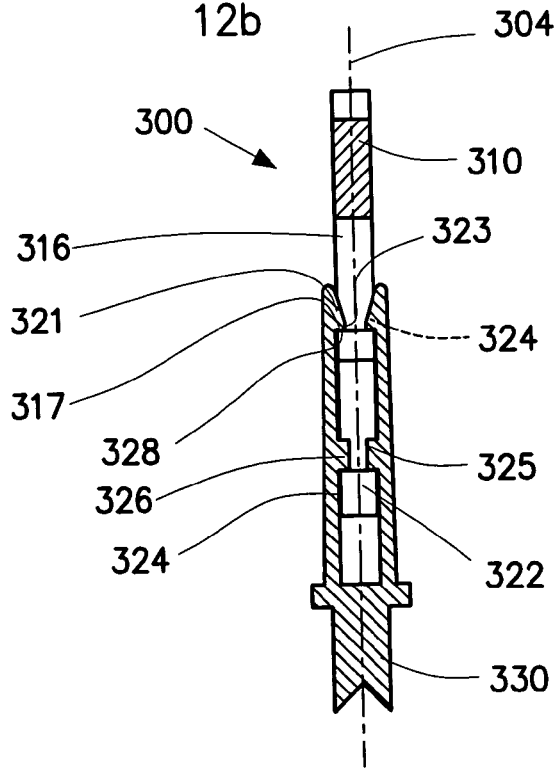
FIG. 12b is a side sectional view, taken along section line 12b—12b of FIG. 12a, and shows the state where the upper and lower contact pins of the contact for the third electronic device, according to the present invention, are coupled to each other.

FIG. 11a is a front view of an upper contact pin 310 of a contact 300 for a third electronic device, according to the present invention. FIG. 11b is a side sectional view of the upper contact pin 310 of the contact 300 for the third electronic device, according to the present invention. FIG. 12a is a front sectional view to show the state where upper and lower contact pins 310 and 330 of the contact 300 for the third electronic device, according to the present invention, are coupled to each other. FIG. 12b is a side sectional view to show the state where the upper and lower contact pins 310 and 330 of the contact 300 for the third electronic device, according to the present invention, are coupled to each other, slidably moveable along the longitudinal axis 308.

The contact 300 for the third electronic device according to this invention includes the upper contact pin 310, the lower contact pin 330, and a spring (not shown). The upper and lower contact pins 310 and 330 have the same construction, and are coupled to be orthogonal to each other. The spring 190 (not shown) is fitted over a predetermined area between the upper and lower contact pins 310 and 330.

Since the spring 190 of the contact for the third electronic device according to this invention has the same construction and function as that of the contact 100 for the first electronic device, the spring 190 will not be described in detail herein.

Further, since the lower contact pin 330 of the contact 300 for the third electronic device according to this invention has the same construction and function as those of the upper contact pin 310 that will be described below, the description of the lower contact pin 330 will be omitted herein.

The construction and function of the upper contact pin 310 of the contact 300 for the third electronic device according to this invention remain the same as those of the upper contact pin 110 of the contact 100 for the first electronic device, except that a hole 316 is formed in place of the second channel 116 defined in the upper contact pin 110, and the center of a stop surface 317 is cut, defining two tabs 325 and 326, so that an elastic part 320 of the upper contact pin 310 is extended.

Figure 1A:
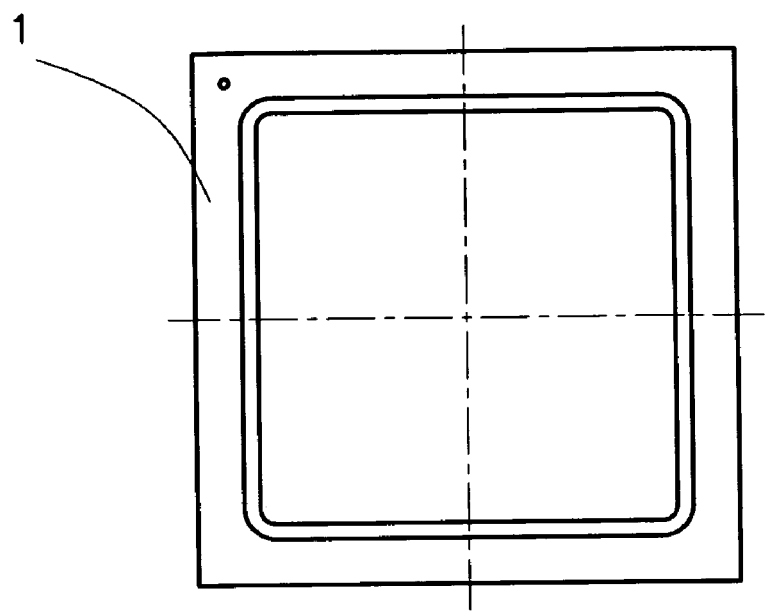
FIG. 1a is a top view of a ball grid array-type semiconductor IC.
Figure 1B:
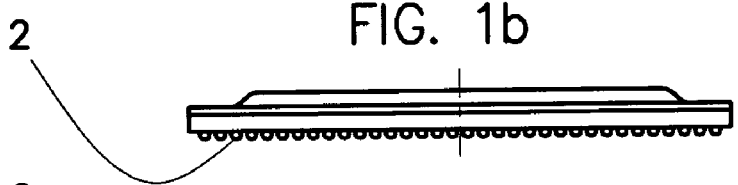
FIG. 1b is a front view of the ball grid array-type semiconductor IC.
Figure 1C:
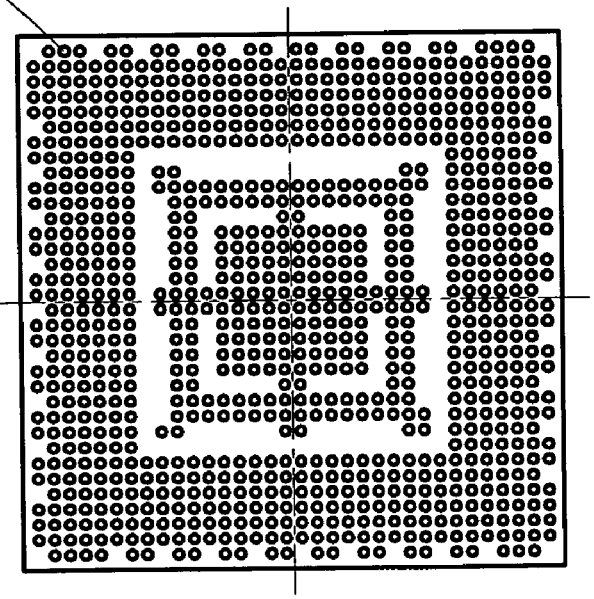
FIG. 1c is a bottom view of the ball grid array-type semiconductor IC.
Figure 2:
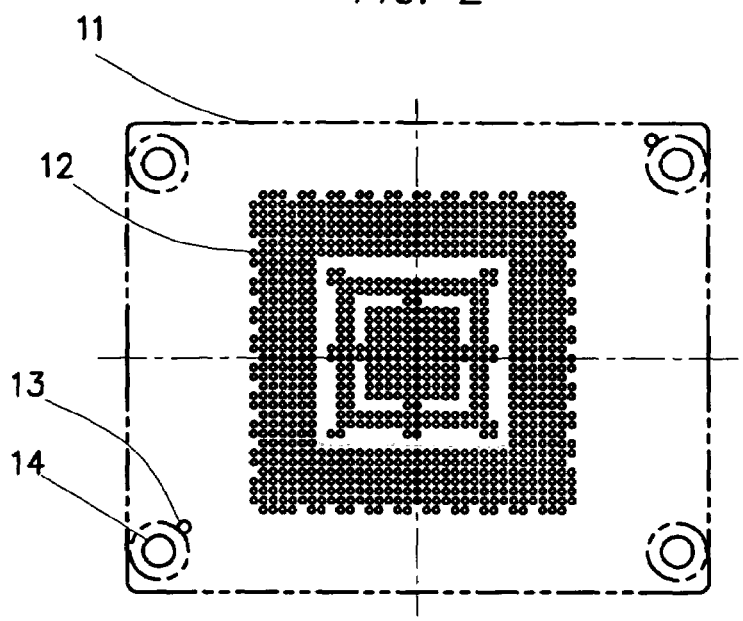
FIG. 2 is a top view of a PCB which is patterned to have one-to-one electrical correspondence with a plurality of ball-type leads of the ball grid array-type semiconductor IC.
Figure 3A:
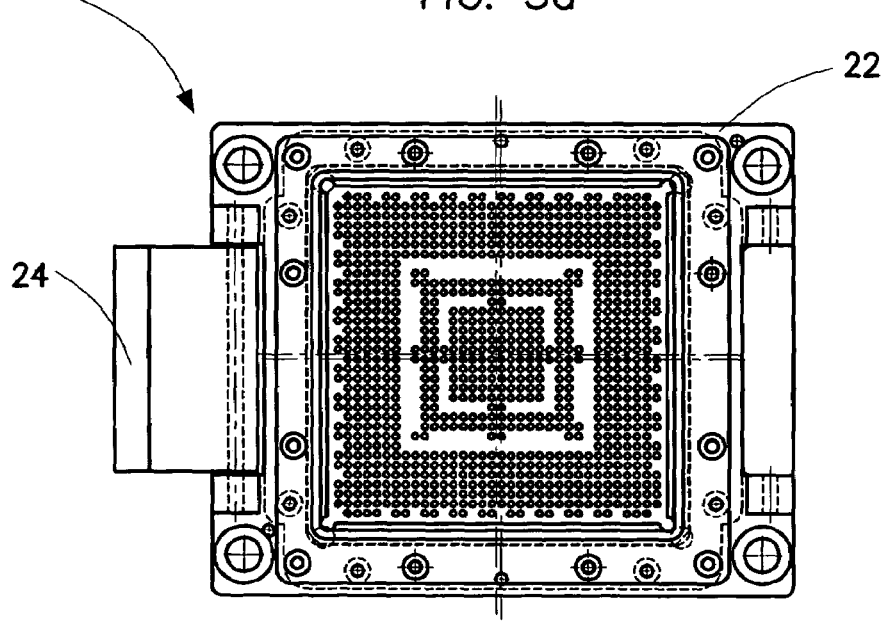
FIG. 3a is a top view of a test socket and shows the cover of the test socket in an open position.
Figure 4:
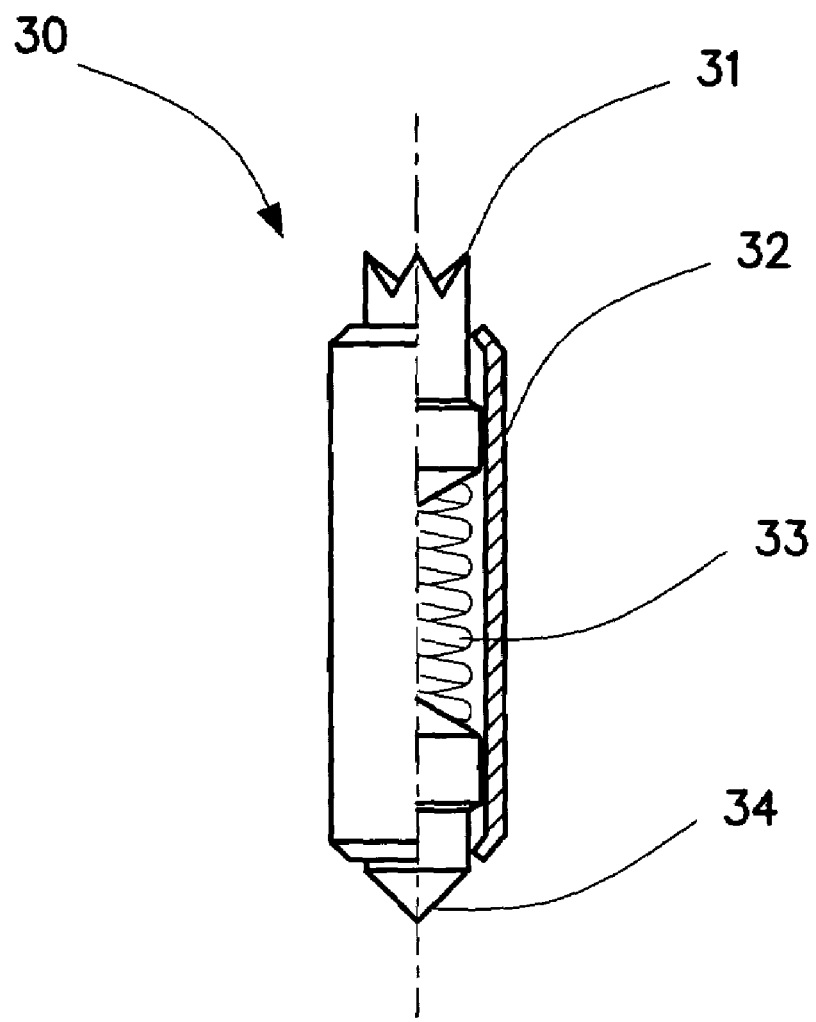
FIG. 4 is a partially cut away view of a conventional contact.

Further, reference numerals 311, 312 and 313, 315, 318, 319, 320, 321, 322, 323, and 324 of FIG. 1a correspond respectively to the contact part 111, the support protrusions 112 and 113, the sidewalls 115, the body 118, the elastic part 119, the first channel 120, the hook 121, the inclined surface 122, the channel contact part 123, and the side contact surface 124 of the contact for the first electronic device. The corresponding components have the same construction and function.

Figure 13A:
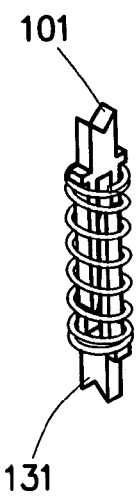
FIG. 13a is a perspective view of a contact for electronic devices having upper and lower contact parts, each having a V shape, according to the present invention.
Figure 13B:
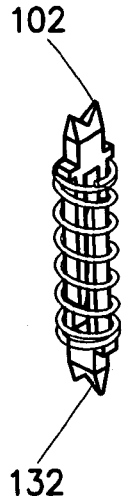
FIG. 13b is a perspective view of a contact for electronic devices having upper and lower contact parts, each having a V shape which is pointed at ends thereof, according to the present invention.
Figure 13C:
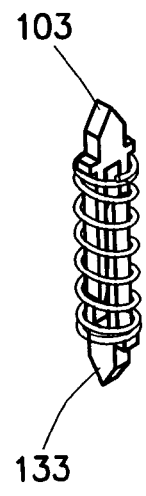
FIG. 13c is a perspective view of a contact for electronic devices having upper and lower contact parts, each having an A shape, according to the present invention.
Figure 13D:
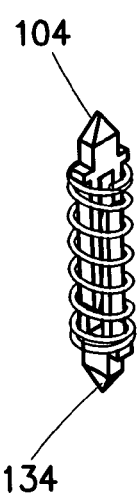
FIG. 13d is a perspective view of a contact for electronic devices having upper and lower contact parts, each having an A shape which is pointed at an end thereof, according to the present invention.
Figure 13E:
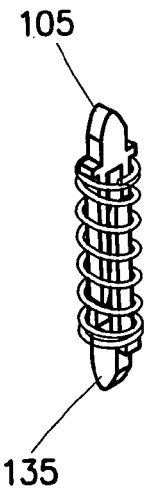
FIG. 13e is a perspective view of a contact for electronic devices having upper and lower contact parts, each having a rounded A shape, according to the present invention.
Figure 13F:
FIG. 13f is a perspective view of a contact for electronic devices having upper and lower contact parts, each having a rounded A shape which is pointed at an end thereof, according to the present invention.
Figure 14A:
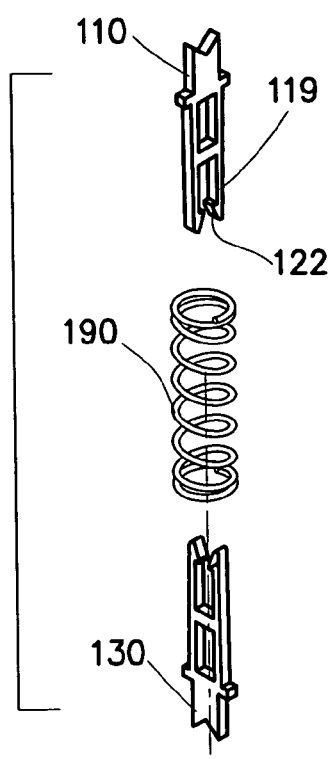
FIGS. 14a—14d are views which show assembly of the contact for the first electronic device, according to the present invention.
Figure 14B:
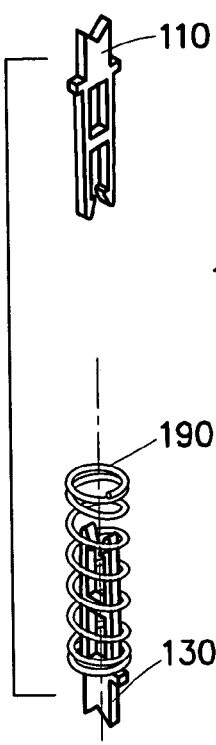
Figure 14C:
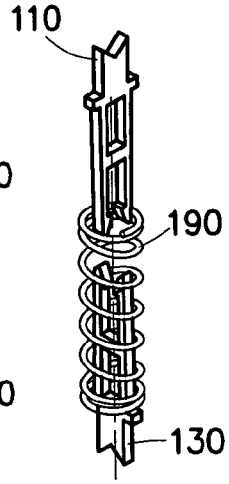
Figure 14D:
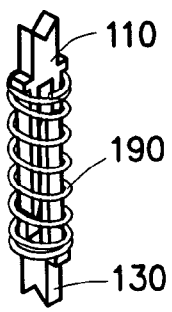

The contacts 100, 200 and 300 for the first to third electronic devices according to this invention may have upper and lower contact parts having various shapes to be suitable for intended purposes. For example, contact pins 110 and 130 may have upper and lower contact parts 101 and 131 which each have a V shape, as shown in FIG. 13a. Upper and lower contact parts 102 and 132 may each have a V shape which is pointed at ends thereof, as shown in FIG. 13b. Upper and lower contact parts 103 and 133 may each have an A shape, as shown in FIG. 13c. Upper and lower contact parts 104 and 134 may each have an A shape which is pointed at an end thereof, as shown in FIG. 13d. Upper and lower contact parts 105 and 135 may each have a rounded A shape, as shown in FIG. 13e. Further, upper and lower contact parts 106 and 136 may each have a rounded A shape which is pointed at an end thereof, as shown in FIG. 13f.

Although not shown in the drawings, the upper and lower contact parts may have shapes other than the above-mentioned shapes to be suitable for the properties of an object to be electrically connected. For example, one of the contact parts has a contact structure as described above, while the other contact part has a solderable structure.

As necessary, the shapes of the upper and lower contact parts may be different from each other.

The assembly of the contact 100 for the first electronic device according to this invention constructed as described above will be described with reference to FIGS. 14a–14d.

FIGS. 14a–14d show the assembly of the contact 100 for the first electronic device, according to the present invention.

First, the spring 190 is fitted over the lower contact pin 130 in a direction from an upper end of the lower contact pin 130 to a lower end thereof. The upper contact pin 110 rotates relative to the lower contact pin 130 at ninety degrees. In such a state, the upper contact pin 110 is inserted into the spring 190.

Thereafter, as shown in FIGS. 8a and 8b, the upper contact pin 110 is inserted until the two hooks 121 of the upper contact pin 110 are stopped by the stop surface 117 provided at a predetermined position in the second channel 116 of the lower contact pin 130. Thereby, the assembly is completed.

At this time, the spring 190 is compressed to some extent. According to the intended purpose of the contact 100, the compression force of the spring 190 is appropriately designed.

For the efficient assembly of the contact 100, that is, for mass production, a contact 100 having proper dimensions may be used or an automatic assembling machine may be developed to maximize the efficiency of production.

The operation of the contact 100 for the first electronic device, according to this invention, which is assembled through the above-mentioned method will be described with reference to FIGS. 15a and 15b.

Figure 15A:
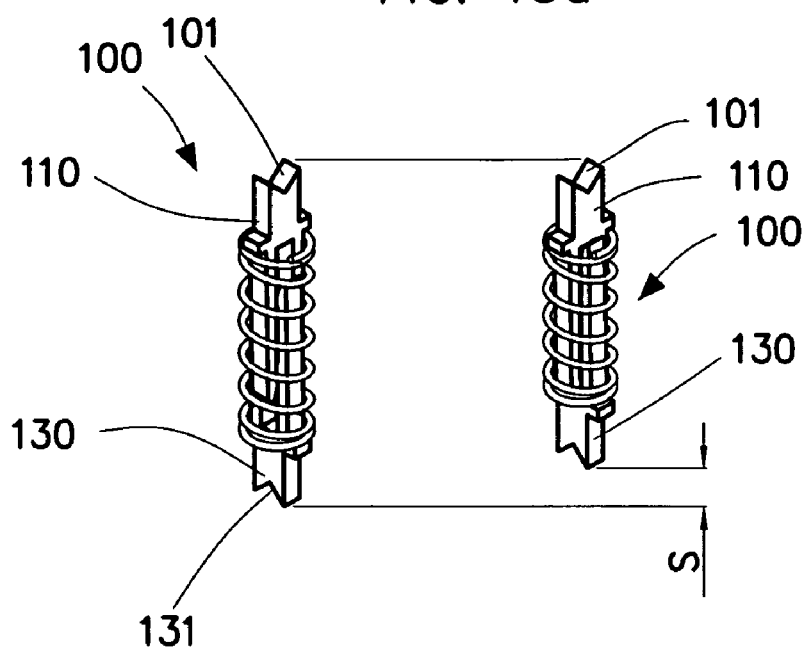
FIG. 15a is a view to illustrate an operating distance of the contact for the first electronic device, according to the present invention.
Figure 15B:
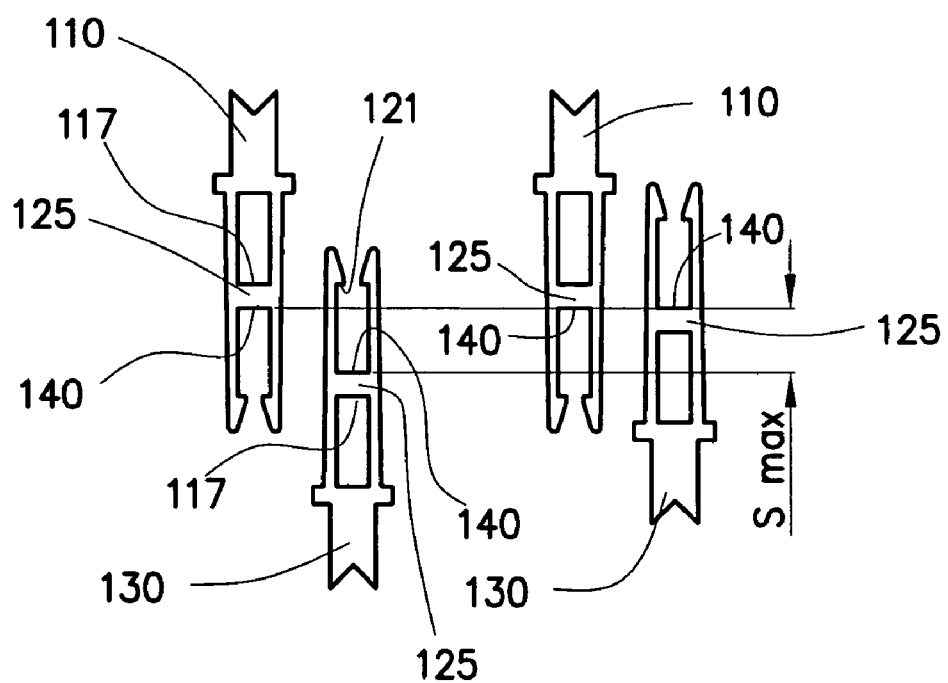
FIG. 15b is a view to illustrate the maximum operating distance of the contact for the first electronic device, according to the present invention.

FIG. 15a is a view to illustrate an operating distance of the contact 100 for the first electronic device, according to the present invention, and FIG. 15b is a view to illustrate the maximum operating distance of the contact 100 for the first electronic device, according to the present invention.

The left portion of FIG. 15a shows the initial state of assembly of the contact 100 for the first electronic device according to this invention, while the right portion of FIG. 15a shows the state where the contact 100 for the first electronic device according to this invention is compressed by a distance S.

Further, when the contact 100 is operated from the initial state of assembly shown in the left portion of FIG. 15a to a state where operation stopping surfaces 140 of the upper and lower contact pins 110 and 130 contact each other, as shown in FIG. 15b, the operation distance becomes the maximum operation distance Smax. It is preferable that the operation distance be seventy percent to eighty percent of the maximum operation distance, when the contact 110 is used in practice.

The examples of using the contact 100, 200 and 300 for electronic devices, according to this invention, which is operated as described above, will be described below with reference to FIGS. 16 and 17.

Figure 16:
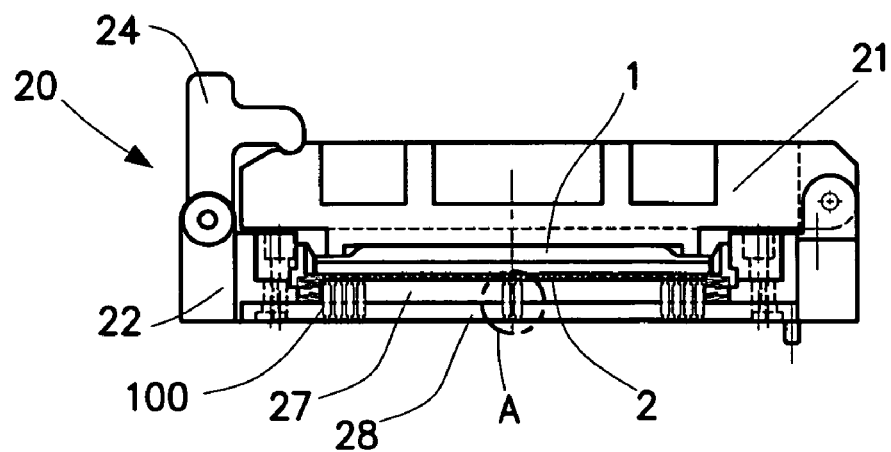
FIG. 16 is a sectional view of a test socket in which the contacts for electronic devices, according to the present invention, are mounted.

FIG. 16 is a sectional view of a test socket 20 in which the contact 100 for electronic devices, according to the present invention, is mounted. FIG. 17 is an enlarged sectional view of portion "A" encircled in FIG. 16.

Figure 17:
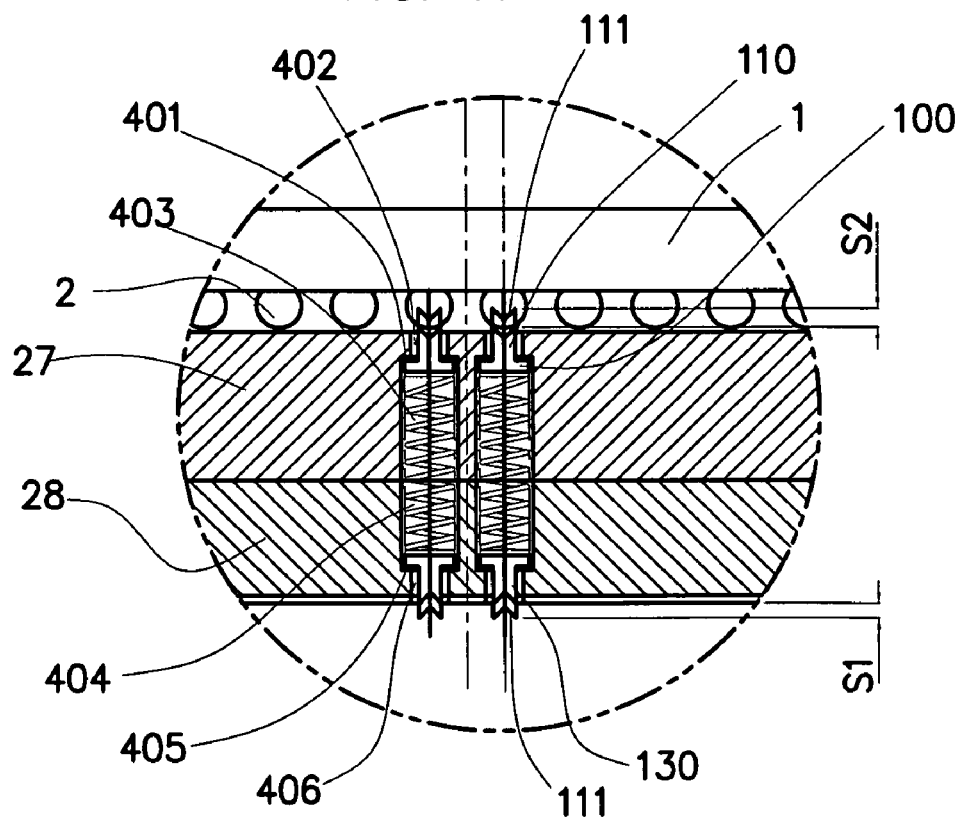
FIG. 17 is an enlarged sectional view of portion "A" encircled in FIG. 16.

As shown in FIGS. 16 and 17, when an electronic device, especially, a semiconductor IC 1, is tested using one of the contacts 100, 200 or 300 for electronic devices, according to this invention, it is preferable that upper and lower bodies 27 and 28 of the test socket have contact seating spaces 403 and 404, contact holding stop shoulders 401 and 405, and contact protrusion holes 402 and 406. A plurality of the contacts 100 are received in the test socket 20.

Preferably, the contact part 111 of the lower contact pin 130 of the contact 100 slightly protrudes from the bottom surface of the socket body 22 by a distance S1. Thus, when the socket 20 is mounted on a PCB, the contact 100 is compressed by the protruding distance S1.

Further, a protruding part 111 of the upper contact pin 110 protruding from the upper body 27 by a distance S2 is in electric contact with a terminal of an electronic device to be tested, especially, a semiconductor IC 1. Referring to FIG. 17, the protruding part contacts a ball shaped lead 2, which is the terminal of a BGA-type IC 1. At this time, the socket cover 21 compresses the IC 1, so that the upper contact pin 110 of the contact 100 is compressed by the distance S2. It is preferable to design the test socket 20 such that the total compression distance S1+S2 of the contact is seventy percent to eighty percent of the above-mentioned maximum operation distance Smax.

Further, according to another example of the use of this invention, the contact is applied to a single row of connectors or a plurality of rows of connectors, so that it is possible to electrically connect PCBs to each other. This invention may be used as a contact for a battery charging terminal of a mobile phone. As such, the contact of this invention may be variously used.

As described above, the present invention provides a contact for electronic devices, capable of efficiently transmitting an electrical signal from an upper contact pin to a lower contact pin. Further, this invention provides a contact for electronic devices, which reduces the number of components, thus enhancing productivity and providing constant product quality, in addition to affording mass production at low cost. Furthermore, this invention provides a contact for electronic devices, which is variously usable. That is, the contact may be used for various sockets for testing semiconductor ICs or various connectors.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A contact for electronic devices, comprising:
    an upper contact pin, comprising:
    a contact part having a predetermined shape and contacting a lead of an object to be tested, two support protrusions, and a body;
    a lower contact pin coupled to the upper contact pin to be orthogonal to the upper contact pin;
    a spring fitted over a predetermined area between the upper and lower contact pins;
    the body of the upper contact pin including inclined surfaces and hooks provided on an end of the body, and two elastic parts provided to be symmetrical with respect to each other;
    a first channel defined by the two elastic parts, and providing a space to allow movement of the lower contact pin, when the lower contact pin is coupled to the upper contact pin; and
    a second channel defined in the body of the upper contact pin to accommodate hooks of the lower contact pin therein such that the lower contact pin is movable, the second channel being in electrical contact with hooks and side contact surfaces of the lower contact pin.

2. The contact for electronic devices as set forth in claim 1, wherein the second channel has a predetermined depth, with a thickness between two bottom ends of the second channel being equal to or larger than a distance between inner ends of the hooks of the elastic parts, which corresponds to a distance between channel contact parts, so that the hooks of the lower contact pin contact a bottom of the second channel, when the upper contact pin is coupled to the lower contact pin.

3. The contact for electronic devices as set forth in claim 1, wherein the contact part of the upper contact pin is selected out of various shapes, including a V shape, a shape of a V which is pointed at ends thereof, an A shape, a shape of an A which is pointed at an end thereof, a rounded A shape, and a rounded A shape which is pointed at an end thereof.

4. The contact for electronic devices as set forth in claim 1, wherein a shape of a contact part of the lower contact pin is different from that of the contact part of the upper contact pin.

5. The contact for electronic devices as set forth in claim 1, wherein the lower contact pin is configured so that the contact part of the lower contact pin is solderable.

6. A contact for electronic devices, comprising:
an upper contact pin including a contact part having a predetermined shape and contacting a lead of an object to be tested, two support protrusions, and a body;
a lower contact pin coupled to the upper contact pin to be orthogonal to the upper contact pin; and
a spring fitted over a predetermined area between the upper and lower contact pins;
the body of the upper contact pin including inclined surfaces and hooks provided on an end of the body, two elastic parts provided to be symmetrical with respect to each other;
a channel defined by the two elastic parts, and providing a space to allow movement of the lower contact pin, when the lower contact pin is coupled to the upper contact pin; and
a hole in the body of the upper contact pin to accommodate hooks of the lower contact pin such that the lower contact pin is movable.

7. The contact for electronic devices as set forth in claim 6, wherein a stop rib provided between the channel and the hole is cut at a center thereof.

8. The contact for electronic devices as set forth in claim 6, wherein the contact part of the upper contact pin is selected out of various shapes, including a V shape, a shape of a V which is pointed at ends thereof, an A shape, a shape of an A which is pointed at an end thereof, a rounded A shape, and a rounded A shape which is pointed at an end thereof.

9. The contact for electronic devices as set forth in claim 6, wherein a shape of a contact part of the lower contact pin is different from that of the contact part of the upper contact pin.

10. The contact for electronic devices as set forth in claim 6, wherein the lower contact pin is configured so that the contact part of the lower contact pin is solderable.

11. A contact for a making an electrical connection, the contact comprising:
a first contact pin having an elongate body, a first end of said elongate body defining a contact portion, a second end having two spaced part, longitudinally extending tangs which extend away from said first end, and at least one first contact pin support protuberance which extends outward from a side of said elongate body;
said longitudinally extending tangs each having a protuberant portion which extends from an inward side of a respective one of said tangs, toward an other of said tangs, said protuberant portions defining catch surfaces;
a second contact pin having an elongate shape, an end portion of said elongate shape defining a contact end, and two exteriorly disposed channel portions extending into opposite sides of said second contact pin, said channel portions extending longitudinally along a length of said second contact pin and adapted for receiving said protuberant portions of respective ones of said tangs, such that said protuberant portions are moveable within said respective ones of said channel portions with said protuberant portions in electrical contact with said second contact pin;
said channel portions in said second contact pin defining stop surfaces which engage said catch surfaces of said tangs of said first contact pin to prevent said second contact pin from moving from between said two tangs of said first contact pin;
said second contact pin having at least one second contact pin support protuberance which extends outward from a side of said elongate body, spaced apart from said first contact pin support protuberance; and
a resilient biasing member extending exteriorly around said first and second contact pins, and between said at least one first contact pin support protuberance and said second contact pin support protuberance to urge said first and second pins to move in opposite directions, with said contact portion of said first contact pin and said contact end of said second contact pin disposed on opposite ends of said first and second contact pins.

12. The contact as set forth in claim 11, wherein said first contact pin and said second contact pin further comprise:
a second contact pin having an second end portion, opposite of said end portion, defining two spaced part, longitudinally extending second contact pin tangs which extend away from said contact end, said second contact pin tangs each having a second contact pin protuberant portion which extends from an inward side of a respective one of said second contact tangs, toward an other of said second contact tangs, and defining second contact pin catch surfaces;
said first contact pin having two exteriorly disposed first contact pin channel portions extending into opposite side portions of said first contact pin, said first contact pin channel portions extending longitudinally along outward sides of said elongate body of said first contact pin, wherein said first contact pin channel portions are adapted for receiving said second contact pin protuberant portions of respective ones of said second contact pin tangs, such that said second contact pin protuberant portions are moveable within said respective ones of said first contact pin channel portions with said second contact pin protuberant portions in electrical contact with said first contact pin; and
said first channel portions in said first contact pin defining first contact pin stop surfaces which engage said second contact pin catch surfaces of said second contact pin tangs to prevent said first contact pin from moving from between said two second contact pin tangs.

13. The contact as set forth in claim 12, wherein said first and second contact pins are aligned such that said tangs of said first contact pin extend in an opposite direction from said contact portion than a direction in which said second contact pin tangs extend from said contact end, with said first contact pin disposed at an angular displacement of approximately ninety degrees from said second contact pin around a longitudinal axis of said first and second contact pins.

14. The contact as set forth in claim 13, wherein said tangs, said first contact pin channel portions and said opposite side portions of said first contact pin are substantially identical to said second contact pin tangs, said channel portions and said sides of said second contact pin, respectively.

15. The contact pin as set forth in claim 14, wherein said first contact pin channel portions and said channel portions of said second contact pins are defined by apertures which extend through said bodies of said first and second contact pins, respectively.

* * * * *